United States Patent [19]
Ennulat et al.

[11] 3,952,275
[45] Apr. 20, 1976

[54] PHOTON SENSOR AND METHOD OF FABRICATION

[75] Inventors: Reinhard D. Ennulat, Alexandria; Paul LoVecchio, Reston; Wolfgang Elser, Alexandria, all of Va.; Philip R. Boyd, Upper Marlboro, Md.

[73] Assignee: The United States of America as represented by the Secretary of the Army, Washington, D.C.

[22] Filed: Oct. 17, 1974

[21] Appl. No.: 515,723

Related U.S. Application Data

[62] Division of Ser. No. 350,286, April 11, 1973, Pat. No. 3,867,757.

[52] U.S. Cl. ............................... 338/18; 29/572; 29/574
[51] Int. Cl.² ................................. H01L 31/08
[58] Field of Search ........................ 338/15–19; 29/572, 574; 250/211 R

[56] References Cited
UNITED STATES PATENTS

| | | | |
|---|---|---|---|
| 2,428,537 | 10/1947 | Veszi et al. | 29/572 X |
| 3,151,379 | 10/1964 | Escoffery | 29/572 |

*Primary Examiner*—C. L. Albritton
*Attorney, Agent, or Firm*—Nathan Edelberg; John E. Holford; Robert P. Gibson

[57] ABSTRACT

A photon sensitive film resistor is provided having a resistance measured in megohms per centimeter. The method of fabrication insures that the resistance is uniformly distributed along the current path.

4 Claims, 6 Drawing Figures

PHOTON SENSOR AND METHOD OF FABRICATION

The invention described herein may be manufactured, used, and licensed by or for the Government for governmental purposes without the payment to us of any royalty thereon.

This is a division, of application ser. no. 350,286, filed Apr. 11, 1973 now U.S. Pat. No. 3,867,757.

BACKGROUND OF THE INVENTION

Infrared photography has shown that a great deal of information about most common scenes can be obtained in the longer wavelength regions which fall outside of visible range. However, such photography has serious limitations. Observable photon wavelengths are limited to less than one micrometer making much of the potential information in the scene unavailable. Also, such systems have no real-time capability, a necessity for many military and civilian tactical uses.

To overcome these limitations photon sensitive diodes and photoconductors have been developed which are sensitive to photons of wavelength greater than one micrometer. Because of the relatively fast response time of these detectors, both to light-on and light-off conditions, they have been incorporated into realtime systems. The disadvantage of these systems has been their requirement for mirrors to scan the field of view. This requirement adds to the weight and power requirements of the final system, in addition to degrading the mechanical ruggedness of the system.

The next generation of infrared viewing systems foresees the elimination of these mechanical scan mirrors. This will require a high density of infrared sensitive detectors over a relatively large area (approximately 1 inch squared). Such detectors, if photoconductive, must have a high resistivity in the direction of the plane on which they are deposited if adequate frame storage times are to be achieved. Presently, the lead salt detectors, if formed by repeated depositions, can exhibit a high resistivity perpendicular to the plane on which they are deposited. The problem of increasing their resistivity in the direction of the plane on which they are deposited is addressed by this invention.

SUMMARY OF THE INVENTION

The present invention provides a film of the same type of material, e.g. lead selenide, having the desired higher resistance due to an improved method of fabrication. The resistance is distributed along the current path through the film which provides greater uniformity of current density and more efficient use of the photoconductive material. This is achieved by depositing the film in layers to form interfaces across the current path which have higher resistance than the film material itself. Heat loss is also distributed evenly through the film thereby making more efficient use of the cryogenic heat sink on which the sensor may be mounted.

BRIEF DESCRIPTION OF THE DRAWINGS

The invention is best understood with reference to the accompanying drawings wherein.

DESCRIPTION OF THE INVENTION

A typical IR sensor element may be square in shape with lateral dimensions of 50 microns and a thickness of 1 micron. Such elements are mounted in arrays, including one dimensional arrays, where the elements may number in the hundreds. The array is preferably cooled by cryogenic devices to a very low temperature. It is preferred that these elements exhibit a high resistance to match the high input impedance of small signal amplifying devices to which they are coupled. As stated above lead selenide sensors currently available have resistances in the 5000 ohm range, while resistances of many millions of ohms are required for maximum efficiency.

Figure 1:
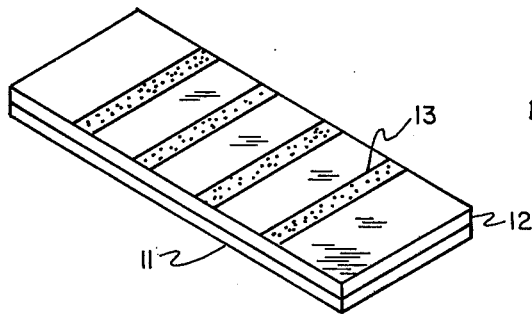
FIG. 1 shows a substrate with a coating of photoconductive material and superposed photoresist material.

FIG. 1 shows a substrate member 11 which provides a base for sensors as described above and which is also used in the present invention. This member is a few millimeters thick and is made from a highly insulating material compatible with lead selenide processing such as quartz, sapphire or strontium titanate. A layer 12 of lead selenide is deposited by any known means. A commercially available photoresist material such as KODAK MICRO-NEG is applied to the exposed flat mirror-like surface of the lead selenide and a light pattern of equally spaced fine lines 13 a few microns wide with spacings many times one line width is projected on the photoresist. After the photoresist is developed, the unprotected portions of the lead selenide are removed by a suitable etchant such as $H_2O_2$, KOH, ethyleneglycol.

Figure 2:
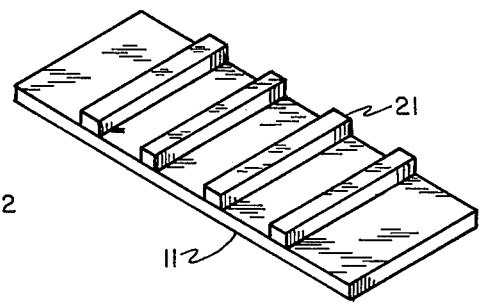
FIG. 2 shows the same substrate after etching and removal of the photoresist.

FIG. 2 shows the structure of the barlike channels 21 of lead selenide that remain after etching. The etchant is applied for a sufficient length of time to remove the unprotected lead selenide completely down to the substrate, which is unaffected by its chemical action. The photoresist is removed after etching using the chemicals recommended by the photoresist manufacturer.

Figure 3:
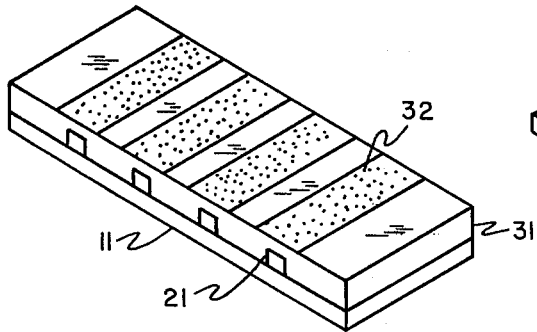
FIG. 3 shows the structure from FIG. 2 after similar processing steps which produced the FIG. 1 structure are repeated.

FIG. 3 shows the resulting structure when the above steps are repeated. The layer 31 of lead selenide is shown approximately twice as thick between channels 21 in order to provide flat working surface, but it is actually only necessary that the surfaces of channels 21 be coated to the desired thickness. The stripes of photoresist are increased in width by approximately a factor of three to protect additional layers on both sides of the channels 21. The stripes of course always have their centerlines in the same parallel planes normal to the substrate.

Figure 4:
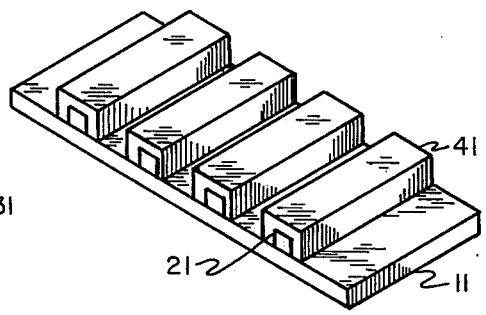
FIG. 4 shows the FIG. 3 structure after the process steps associated with FIG. 2 are repeated.

FIG. 4 shows the structure obtained after a second etching of the unprotected lead selenide. A new channel 41 has been formed around the original channel 21. The dimensions of the channels as shown are much greater than they would be in an actual sensor. By repeating the above steps and increasing the width of the stripes by consecutive odd multiples a large number of nesting channels can be built up before the spacing between nested sets of channels becomes approximately equal to the thickness of a channel layer. At this point an ohmic contact 52 is attached to each end of the substrate and a final layer is applied which fills in the spaces between sets of channels and the ohmic contacts.

Figure 5:
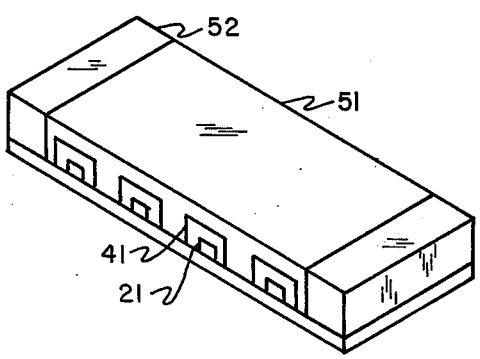
FIG. 5 shows the FIG. 4 structure with ohmic contacts cemented to the substrate and a final coating of semiconductor.

FIG. 5 shows the resulting structure after the last layer of lead selenide is deposited. Normal processing procedures create a fair amount of resistance at the interfaces between the layers. Oxidation in a controlled atmosphere and at selected temperatures will provide many orders of magnitude greater resistance in the interface region as compared to the resistance of lead selenide material. It can readily be seen that the current paths nearest the last layer encompass fewer of the interfaces than a path nearer the substrate. And even though the last layer provides direct conduction, the average resistance of all the layers will be much greater than a single layer of lead selenide having the same thickness. The resistance can be increased by etching through the last layer leaving the portions thereof near the substrate. This etching can be continued through successive layers producing a steady increase in resistance of the structure between the ohmic contacts. Timing is important in performing this step. By alternately etching and measuring the resistance between the ohmic contacts penetration of each layer can be detected. The ohmic contacts may be gold, silver, copper or other low resistance material.

Figure 6:
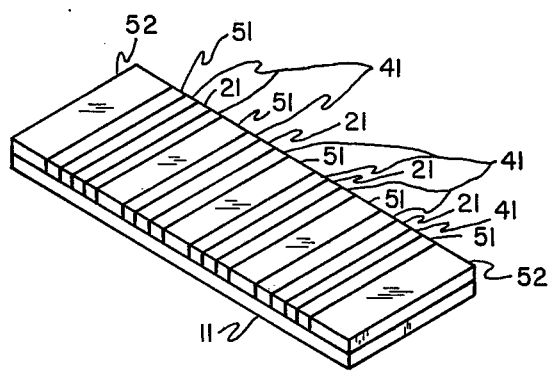
FIG. 6 shows the structure of the sensor after a final etching.

FIG. 6 shows the structure that results when parts of all of the layers are etched away. Obviously this is highest resistance obtainable. Every available interface resistance is involved in every current path. Once an acceptable level of resistance is achieved, the resistance can be trimmed mechanically by reducing the overall width of the sensor element, i.e., the longest dimension of the lead selenide channels. The resistance can also be controlled over a narrow range by doping the lead selenide with group III or V materials.

Obviously many variations of the disclosed methods and resultance structures will be readily apparent to those skilled in the art, but the invention is limited only as specified in the claims which follow.

We claim:

1. An IR sensing element comprising:
   a substrate of insulating material; and
   a plurality of barlike channels of the same photoconductive material transversely arranged on one surface of said substrate with broad surface areas of each channel in contiguous contact with at least one but not more than two other channels whereby all of said channels are serially connected to form a conducting path.

2. An IR sensing element according to claim 1 wherein two end channels contact one other channel and the remaining channels contact two other channels.

3. An IR sensing element according to claim 1 wherein:
   the contacting surfaces of said channels are at least partially oxidized.

4. An IR sensing element according to claim 2 wherein:
   an ohmic contact is attached to each of said end channels.

* * * * *